(12) United States Patent
Uppunda

(10) Patent No.: US 11,797,719 B2
(45) Date of Patent: Oct. 24, 2023

(54) DYNAMIC PREVIEW GENERATION IN A PRODUCT LIFECYCLE MANAGEMENT ENVIRONMENT

(71) Applicant: Prashanth Uppunda, Karnataka (IN)

(72) Inventor: Prashanth Uppunda, Karnataka (IN)

(73) Assignee: SIEMENS AKTIENGESELLSCHAFT, Munich (DE)

(*) Notice: Subject to any disclaimer, the term of this patent is extended or adjusted under 35 U.S.C. 154(b) by 740 days.

(21) Appl. No.: 16/123,163

(22) Filed: Sep. 6, 2018

(65) Prior Publication Data
US 2019/0073436 A1    Mar. 7, 2019

(30) Foreign Application Priority Data
Sep. 7, 2017   (EP) ..................................... 17189920

(51) Int. Cl.
*G06T 19/00* (2011.01)
*G06F 3/04842* (2022.01)
(Continued)

(52) U.S. Cl.
CPC .......... *G06F 30/00* (2020.01); *G06F 3/04842* (2013.01); *G06F 9/451* (2018.02); *G06T 19/003* (2013.01); *G06F 2203/04802* (2013.01)

(58) Field of Classification Search
CPC ...... G06F 30/00; G06F 9/451; G06F 3/04842; G06F 2203/04802; G06T 19/003
See application file for complete search history.

(56) References Cited

U.S. PATENT DOCUMENTS

| 7,814,429 B2* | 10/2010 | Buffet ................... G06Q 10/10 715/763 |
| 8,661,339 B2* | 2/2014 | Weeldreyer ........... G06F 40/109 715/252 |

(Continued)

FOREIGN PATENT DOCUMENTS

| CN | 1818843 A | 8/2006 |
| CN | 105759644 A | 7/2016 |
| WO | WO-2016144977 A1 * | 9/2016 ............. G06F 1/163 |

OTHER PUBLICATIONS

Nicholas Butler; "Output graphics files using your printing code" article on code project; (Year: 2005).*

(Continued)

*Primary Examiner* — Rehana Perveen
*Assistant Examiner* — Nupur Debnath
(74) *Attorney, Agent, or Firm* — LEMPIA SUMMERFIELD KATZ LLC

(57) ABSTRACT

A method and system of dynamically generating a preview of an engineering object in a product lifecycle management environment is provided. A preview generation module is configured to obtain a meta file indicating association of one or more preview strategies selected from a plurality of preview strategies with the engineering object. The preview generation module is also configured to determine preview strategies associated with the engineering object based on the association of the preview strategies with the engineering object in the meta file, to dynamically generate a preview of the engineering object according to the determined preview strategies, and to display the generated preview of the engineering object on a graphical user interface of the user device.

12 Claims, 14 Drawing Sheets

(51) Int. Cl.
   *G06F 9/451*            (2018.01)
   *G06F 30/00*            (2020.01)

(56) References Cited

U.S. PATENT DOCUMENTS

| | | | | |
|---|---|---|---|---|
| 9,123,385 | B2* | 9/2015 | Isozu | G06F 16/743 |
| 9,935,996 | B2* | 4/2018 | Jaskiewicz | H04L 65/612 |
| 10,152,198 | B2* | 12/2018 | Radet | G06T 19/00 |
| 2007/0168060 | A1* | 7/2007 | Nixon | G06T 13/00 |
| | | | | 700/83 |
| 2010/0082497 | A1* | 4/2010 | Biesemann | G06Q 10/103 |
| | | | | 705/301 |
| 2012/0019861 | A1* | 1/2012 | Okada | G06K 15/4075 |
| | | | | 358/1.15 |
| 2013/0110679 | A1* | 5/2013 | Spadafora | G06Q 30/02 |
| | | | | 705/26.63 |
| 2013/0117107 | A1* | 5/2013 | Evans | G06Q 30/0276 |
| | | | | 705/14.72 |
| 2014/0019213 | A1* | 1/2014 | Marpe | G06Q 10/0637 |
| | | | | 705/7.36 |
| 2014/0136951 | A1* | 5/2014 | Kumar | G06F 16/9574 |
| | | | | 715/234 |
| 2015/0029181 | A1* | 1/2015 | Lerey | G06F 30/18 |
| | | | | 345/419 |
| 2015/0370455 | A1* | 12/2015 | Van Os | G06F 3/0482 |
| | | | | 345/173 |
| 2016/0092180 | A1* | 3/2016 | Straub | G06T 1/0007 |
| | | | | 715/762 |
| 2016/0179998 | A1* | 6/2016 | Gueguen | G06F 3/0484 |
| | | | | 703/1 |
| 2016/0358311 | A1* | 12/2016 | Chen | G06F 3/04847 |
| 2017/0046310 | A1 | 2/2017 | Kikin-Gil et al. | |
| 2017/0153809 | A1* | 6/2017 | Yang | G06F 3/04883 |
| 2017/0357655 | A1* | 12/2017 | Marchiori | G06F 3/04842 |
| 2019/0236825 | A1* | 8/2019 | Straub | G06F 9/451 |

OTHER PUBLICATIONS https://flylib.com/books/en/2.72.1/working_with_metafiles.html; book on metafile (Year: 2008).*
https://risa.com/risahelp/risa3d/Content/Common_Topics/Printing.htm; Printing reports and adding images (Year: 2015).*
https://www.w3.org/TR/2007/REC-webcgm20-20070130/WebCGM20-IC.html; Documents regarding XML (Year: 2007).*
Butler, Nicholas, Output graphics files using your printing code, article on code project; 2005; 6 pp.
Chinese Action cited in corresponding Chinese app No. 201811044108.5; dated Feb. 3, 2021; 10 pp.
EPO Communication cited in corresponding EPO app No. 17189920.6, dated Feb. 8, 2021; 4 pp.
Working with Metafiles, https://flylib.com/books/en/2.72.1/working_with_metafiles.html; book on metafile; 2008; 16 pp.

* cited by examiner

DYNAMIC PREVIEW GENERATION IN A PRODUCT LIFECYCLE MANAGEMENT ENVIRONMENT

CROSS REFERENCE TO RELATED APPLICATIONS

This patent application priority from European Patent Application no. 17189920.6 filed on Sep. 7, 2017, which is hereby incorporated in its entirety.

FIELD OF TECHNOLOGY

Embodiments relate to product lifecycle management systems, and to a method and system for dynamically generating preview of an engineering object in a product lifecycle management environment.

BACKGROUND

In automation system, prior to configuring an automation device such as a programmable logic controller (PLC) or a human-machine interface, a designer creates an engineering project using engineering software at an engineering station. The engineering project may include one or more engineering objects. The engineering object used in the engineering project may depend on the type of engineering project. For example, if the engineering project is associated with HMI screens, then the engineering objects may include HMI screens, runtime controls, etc. If the engineering project is hardware configuration, then the engineering objects may include PLC, I/O modules, etc. On the other hand, the engineering project may constitute an engineering object.

The engineering project may be created and stored a product lifecycle management system so that the engineering project may be accessed later. The product lifecycle management system is configured to store large number of engineering projects that may accessed anytime during a lifecycle of a project.

When a user tries to access a particular engineering project via the product lifecycle management system, a high level preview of the engineering project is displayed in conjunction with associated information (e.g., Bill of materials (BOM)) of the engineering project on a graphical user interface of the product lifecycle management system. A preview helps the user in quickly reviewing several engineering projects without accessing respective engineering project files, saving significant effort and time in locating an engineering project(s) of interest among a plurality of engineering projects displayed on the graphical user interface.

However, in case of engineering project, the high level preview may not facilitate to quickly have an understanding about the engineering project unlike a three-dimensional geometry of a component. However, the engineering project may be of several types and includes lot of engineering objects such as PLCs, I/O modules, HMI screens, tag tables, function block diagrams, etc. that are not displayed to the user in the product lifecycle management system as a part of high level preview. Consequently, the user has to go through each and every engineering project to have a fair understanding of the engineering projects and locate an engineering project of interest among the plurality of the engineering projects. As a result, the purpose of displaying the preview is not served.

SUMMARY

A method and apparatus for dynamic preview generation in a product lifecycle environment are provided. In an embodiment, a method of dynamically generating a preview of an engineering object in a product lifecycle management environment is disclosed. The engineering object may be automation engineering project, runtime objects, human-machine interface (HMI) screen, function block diagram, tag table, engineering library and other automation engineering specific artifacts. The preview may be a representation of the engineering object provided to a user (e.g., automation engineer) on a graphical user interface of an engineering tool to quickly get an idea of the engineering object without going into the details of the engineering project. The product lifecycle management environment provides for the user to perform end-to-end activities related to automation engineering including but not limited to creating engineering objects using an engineering tool, storing the engineering objects and associated information in a product lifecycle management database, managing the information associated with the engineering objects, providing reuse of the engineering objects in a multi-user environment.

The method includes receiving a request to display a preview of the engineering object from a user device, and obtaining a meta file indicating association of one or more preview strategies selected from a plurality of preview strategies with the engineering object from the product lifecycle management database. Each of the preview strategies indicates a type of preview to be displayed for an engineering object. For example, a preview strategy may indicate that a preview shall be a detailed view, network view, function block list, main screen, object view, etc. The association of the preview strategies with the engineering object indicates type of preview to be displayed for the engineering object.

The method also includes determining the one or more preview strategies associated with the engineering object based on the association of the one or more preview strategies with the engineering object in the meta file. Furthermore, the method includes dynamically generating a preview of the engineering object according to the determined preview strategies.

The method may include displaying the generated preview of the engineering object on a graphical user interface of the user device.

The method may include receiving a request for storing the engineering object, and selecting the one or more preview strategies for displaying the preview of the engineering object from the plurality of preview strategies using attributes associated with the one or more preview strategies. In an embodiment, the one or more preview strategies are selected based on preset preview preference corresponding to type of engineering object. In another embodiment, the one or more preview strategies are selected based on profile data of users likely to access the engineering object. In yet another embodiment, the one or more preview strategies are selected based on a pattern of previous selection of preview strategies for specific types of engineering objects.

The method may include associating the one or more preview strategies with the engineering object, and storing the engineering object along with a meta file indicating association of the one or more preview strategies with the engineering object in the product lifecycle management database.

In generating the preview of the engineering object according to the determined preview strategies, the method may include determining whether more than one preview strategy is associated with the engineering object. The method may also include generating preview images of the engineering object according to the respective preview strategies if more than one preview strategy is associated with the engineering object. Furthermore, the method may include generating the preview of engineering object by combining the preview images of the engineering object.

The method may include receiving a request to modify the displayed preview of engineering object from the user device. The request to modify the preview includes a preview strategy for displaying preview of the engineering object. The method may also include dynamically generating a preview of the engineering object according to the preview strategy in the request, and displaying the preview of the engineering object on the graphical user interface of the user device.

In an embodiment, an apparatus is provided that includes a processor, and a memory coupled to the processor. The memory includes a preview generation module stored in the form of machine-readable instructions executable by the processor. The preview generation module is configured for obtaining a meta file indicating association of one or more preview strategies selected from a plurality of preview strategies with an engineering object from a product lifecycle management database. The preview generation module is configured for determining the one or more preview strategies associated with the engineering object based on the association of the one or more preview strategies with the engineering object in the meta file, and dynamically generating a preview of the engineering object according to the determined preview strategies.

The preview generation module may be configured for displaying the generated preview of the engineering object on a graphical user interface of the user device.

The preview generation module may be configured for selecting the one or more preview strategies for displaying the preview of the engineering object from a plurality of preview strategies using attributes associated with the one or more preview strategies. In one embodiment, the preview generation module may be configured for selecting the one or more preview strategies based on preset preview preference corresponding to type of engineering object. In another embodiment, the preview generation module may be configured for selecting the one or more preview strategies based on profile data of users likely to access the engineering object. In yet another embodiment, the preview generation module may be configured for the preview generation module is configured for selecting the one or more preview strategies based on a pattern of previous selection of preview strategies for specific types of engineering objects. Furthermore, the preview generation module may be configured for associating the one or more preview strategies with the engineering object, and storing the engineering object along with the meta file indicating the association of the one or more preview strategies with the engineering object in the product lifecycle management database.

The preview generation module may be configured for determining whether more than one preview strategy is associated with the engineering object. If more than one preview strategy is associated with the engineering object, the preview generation module may be configured for generating preview images of the engineering object according to the respective preview strategies, and generating the preview of engineering object by combining the preview images of the engineering object.

In an embodiment, a non-transitory computer-readable storage medium, including machine-readable instructions stored therein, is provided that when executed by at least one processor, cause the processor to perform the method steps described above.

DETAILED DESCRIPTION

A method and apparatus for dynamic preview generation in a product lifecycle environment is disclosed.

Figure 1:
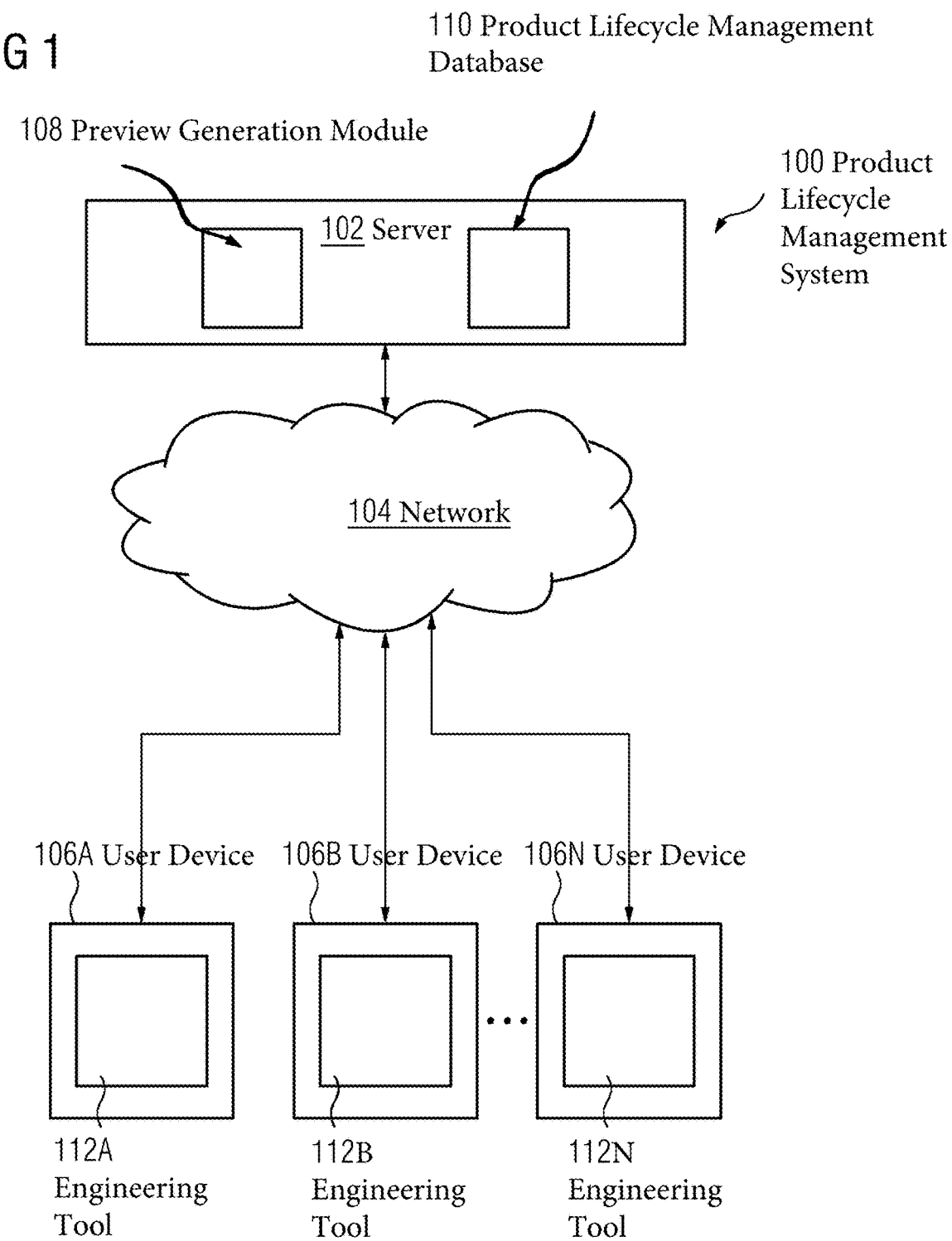
FIG. 1 depicts is a block diagram of a product lifecycle management system, according to an embodiment.

FIG. 1 depicts a block diagram of a product lifecycle management system 100, according to an embodiment. The project lifecycle management system 100 includes a server 102 and user devices 106A-N. The user devices 106A-N are connected to the server 102 via a network 104 such as Local Area Network (LAN), Wide Area Network (WAN), Wi-Fi, etc.

The server 102 includes a preview generation module 108 and a product lifecycle management database 110. The preview generation module 108 may be stored in the form of machine-readable instructions. The server 102 may be a standalone server or a server in a cloud infrastructure. For example, the server 102 may be a part of a public cloud or private cloud.

The user devices 106A-N may be a desktop computer, laptop computer, tablet, smart phone and the like. Each of the user devices 106A-N is provided with engineering tool 112A-N for creating and managing engineering objects. In an implementation, an engineering object may be an automation engineering project such as hardware configuration project. In another implementation, the engineering object may be an element in an automation engineering project such as a Programmable Logic Controller (PLC) object, Human-Machine Interface (HMI) object, HMI tag table, function block diagram, PLC tag table, etc. The user devices 106A-N may enable users to create, store, access, edit, and use one or more engineering objects associated with an automation system in a multi-user environment. The engineering objects are used for configuring automation devices/automation system of an industrial plant.

The user device 106A sends a request to the server 102 for storing a newly created engineering object (e.g., an automation engineering project) using the respective engineering tool 112A in the product lifecycle management database 110. In response to the received request, the preview generation module 108 selects a preview strategy for displaying a preview of the engineering object from a plurality of preview strategies using attributes associated with the preview strategy. The plurality of preview strategies with attribute information is stored in extended markup language format in the product lifecycle management database 110 as depicted below:

TABLE 1

```
<?xml version="1.0" encoding="utf-8" ?>
<PreviewPreparationStrategies>
<Strategy UniqueID="1" DisplayName="HW Configuration Net View" Component="PreviewStrategy.HWConfigurationNetView">
<AllowedTypes>
    <Type TypeName="Type.Project"/>
</AllowedTypes>
</Strategy>
<Strategy UniqueID="2" DisplayName="PLC List" Component="PreviewStrategy.PLCList">
<AllowedTypes>
    <Type TypeName="Type.Project"/>
</AllowedTypes>
</Strategy>
<Strategy UniqueID="3" DisplayName="Function Block List" Component="PreviewStrategy.FunctionBlockList">
<AllowedTypes>
    <Type TypeName="Type.PLC"/>
</AllowedTypes>
</Strategy>
<Strategy UniqueID="4" DisplayName="Device Detailed View" Component="PreviewStrategy.DeviceDetailedView">
< AllowedTypes>
    <Type TypeName="Type.Device.PLC"/>
    <Type TypeName="Type.Device.HMI"/>
</AllowedTypes>
<Strategy UniqueID="5" DisplayName="Object View" Component="PreviewStrategy.ObjectView">
<AllowedTypes>
    <Type TypeName="Type.Device.PLC.FunctionBlock"/>
    <Type TypeName="Type.Device.HMI.Screen"/>
</AllowedTypes>
</Strategy>
<Strategy UniqueID="6" DisplayName="Type List" Component="PreviewStrategy.TypeList">
<AllowedTypes>
    <Type TypeName="Type.Library"/>
</AllowedTypes>
</Strategy>
<Strategy UniqueID="7" DisplayName="Custom View" Component="PreviewStrategy.CustomView">
<AllowedTypes>
    <Type TypeName="Type.All"/>
</AllowedTypes>
</Strategy>
<Strategy UniqueID="8" DisplayName="Main Screen Of HMI" Component="PreviewStrategy.MainScreenOfHMI">
<AllowedTypes>
    <Type TypeName="Type.Device.HMI"/>
</AllowedTypes>
</Strategy>
</PreviewPreparationStrategies>
```

For example, the attributes associated with the strategy may include unique identifier, modules to be loaded when the preview strategy is executed, and type of engineering objects that are allowed for associating a particular preview strategy. For example, a preview strategy for displaying hardware configuration network view as a preview includes unique ID as '1', 'HWConfigurationNetView' as module to be loaded, and allowed type as 'automation engineering project'. Similarly, a preview strategy for detailed device view includes unique ID as '4', 'DeviceDetailedView' as modules to be loaded, and 'PLC object' and 'HMI object' as types of engineering objects allowed for use. It is also possible that multiple preview strategies are selected for displaying preview of the engineering object.

The preview generation module 108 associates the selected preview strategy with the engineering object. Each engineering object includes a 'type name' Based on the 'type name', the selected preview strategy is associated with a specific type of engineering object. Furthermore, the preview generation module 108 stores the engineering object with a meta file indicating association of the preview strategy with the engineering object in the product lifecycle management database 110. The meta file indicating association of the preview strategy with the engineering object is stored in an extended markup language format. An meta file indicating association between preview strategies and engineering objects is depicted below:

TABLE 2

```
<?xml version="1.0" encoding="utf-8" ?>
<TypeStrategyAssociations>
<Association TypeName="Type.Project">
    <Strategies>
        <Strategy UniqueID="1"/>
    </Strategies>
</Association>
<Association TypeName="Type.Device.PLC">
    <Strategies>
        <Strategy UniqueID="4"/>
    </Strategies>
</Association>
<Association TypeName="Type.Device.PLC" ObjectName="Project1\PLC_1">
    <Strategies>
        <Strategy UniqueID="4"/>
        <Strategy UniqueID="3"/>
    </Strategies>
</Association>
<Association TypeName="Type.Device.PLC" ObjectName="Project12\PLC_7">
    <Strategies>
        <Strategy UniqueID="3"/>
    </Strategies>
</Association>
<Association TypeName="Type.Device.HMI">
    <Strategies>
        <Strategy UniqueID="8"/>
    </Strategies>
</Association>
<Association TypeName="Type.Device.HMI" ObjectName="Project1\HMI_1">
    <Strategies>
        <Strategy UniqueID="4"/>
        <Strategy UniqueID="8"/>
    </Strategies>
</Association>
<Association TypeName="Type.Device.PLC.FunctionBlock">
    <Strategies>
        <Strategy UniqueID="5"/>
    </Strategies>
</Association>
<Association TypeName="Type.Device.HMI.Screen">
    <Strategies>
        <Strategy UniqueID="5"/>
    </Strategies>
</Association>
</TypeStrategyAssociations >
```

In another instance, the user device 106B sends a request to display a preview of the engineering object to the server 102. The preview generation module 108 obtains the meta file indicating association of the preview strategy with the requested engineering object from the product lifecycle management database 110. The preview generation module 108 obtains the meta file associated with the engineering object from the project lifecycle management database 110 based on a unique identifier (e.g., Project200/PLC12) associated with the requested engineering object.

The preview generation module 108 determines the preview strategy associated with the engineering object based on the association of the preview strategy with the engineering object. The preview generation module 108 dynamically generates a preview of the engineering object based on the determined preview strategy. In an implementation, the preview generation module 108 generates the preview of the engineering object by loading a preview strategy component associated with the determined preview strategy and making a call to appropriate interface method.

In case more than one preview strategy is associated with the engineering object, the preview generation module 108 generates preview images of the engineering object by loading components of the respective preview strategies. Then, the preview generation module 108 generates a preview of engineering object by combining the generated preview images using appropriate image concatenation techniques known in the art. The preview generation module 108 sends the generated preview and the engineering object to the user device 106B in response to the request. Accordingly, the user device 106B displays the preview of the engineering object in a graphical user interface of the engineering tool 112B.

In yet another instance, the user device 106C sends a request to modify the displayed preview of the engineering object to the server 102. The request includes a new preview strategy to be associated with the engineering object. Based on the received request, the preview generation module 108 dynamically generates a preview of the engineering object by loading components of the new preview strategy. Accordingly, the server 102 sends the preview of the engineering object to the user device 106C in response to the received request. The user device 106C displays the preview of the engineering object on a graphical user interface associated with the engineering tool 112C. The server 102 generates customized preview of engineering objects based on preview strategies associated with the engineering objects. The customized preview of the engineering object helps a user to quickly get an idea of content of engineering object without opening the engineering object in the product lifecycle management environment. The user may quickly screen through large number of engineering objects using the engineering tool 112 by simply viewing the preview of the engineering objects, thereby saving time and effort to open and view each engineering artifact.

Figure 2:
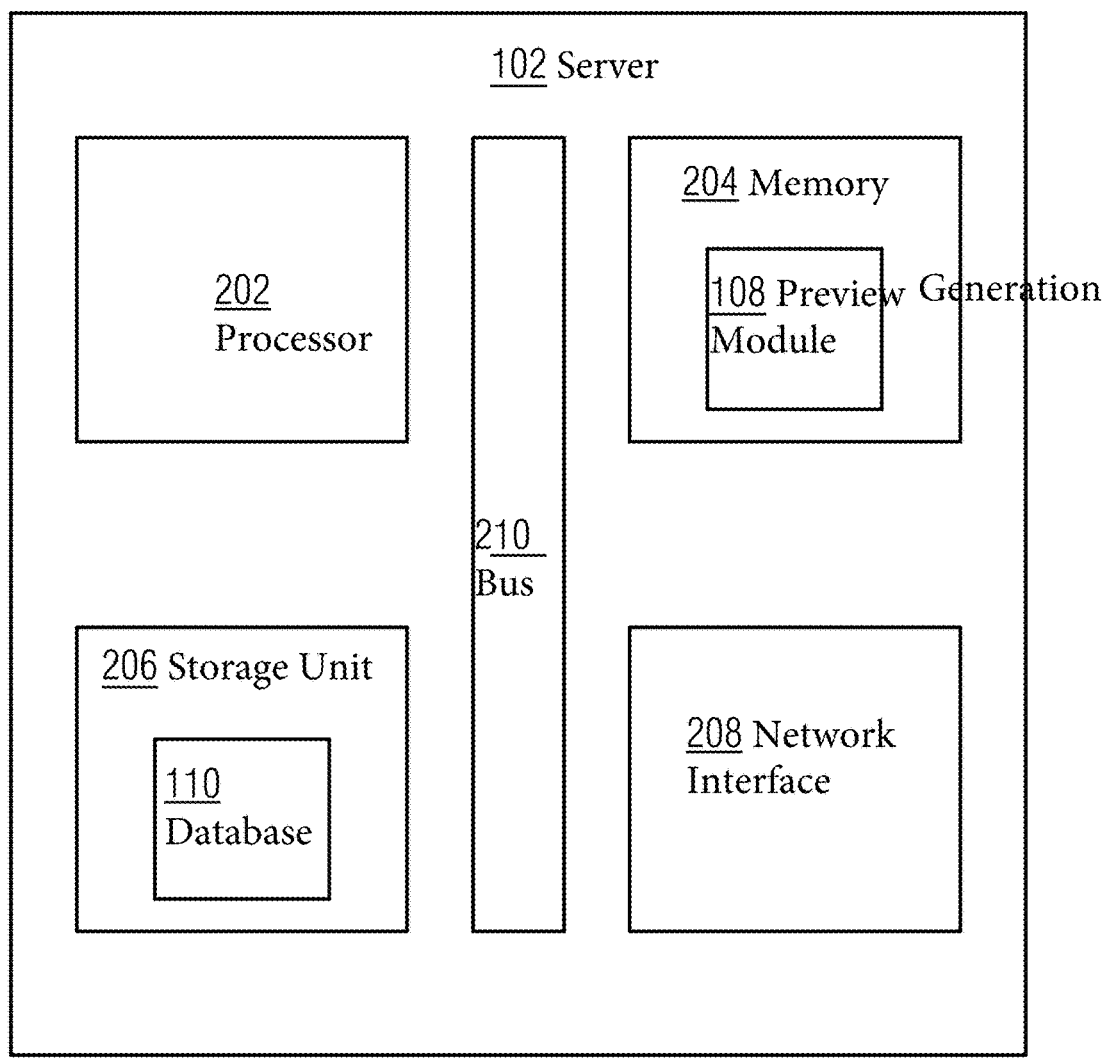
FIG. 2 depicts is a block diagram of a server configured for dynamically generating a preview of an engineering object in a product lifecycle management environment, according to an embodiment.

FIG. 2 depicts a block diagram of the server 102 configured for dynamically generating a preview of engineering object in a product lifecycle management environment 100, according to an embodiment. The server 102 includes a processor 202, a memory 204, a storage unit 206, a network interface 208, and a bus 210.

The processor 202 may be any type of computational circuit, such as, but not limited to, a microprocessor, a microcontroller, a complex instruction set computing microprocessor, a reduced instruction set computing microprocessor, a very long instruction word microprocessor, an explicitly parallel instruction computing microprocessor, a graphics processor, a digital signal processor, or any other type of processing circuit. The processor 202 may also include embedded controllers, such as generic or programmable logic devices or arrays, application specific integrated circuits, or single-chip computers among others.

The memory 204 may be volatile memory and non-volatile memory. A variety of computer-readable storage media may be stored in and accessed from the memory 204. The memory 204 may include any suitable elements for storing data and machine-readable instructions, such as read only memory, random access memory, erasable programmable read only memory, electrically erasable programmable read only memory, hard drive, removable media drive for handling compact disks, digital video disks, diskettes, magnetic tape cartridges, memory cards, and the like. As depicted, the memory 204 includes the preview generation module 108. The preview generation module 108 is stored in the form of machine-readable instructions on any of the abovementioned storage media and executable by the processor 202.

For example, when the instructions are executed by the processor 202, the preview generation module 108, causes the processor 202, to associate preview strategies with an engineering object and dynamically generate a preview of the engineering object based on the preview strategies as described above. The steps performed by the processor 102 upon execution of the machine-readable instructions are described in greater detail with reference to FIGS. 3 to 5 in the below description.

The storage unit 206 may be a non-transitory storage medium configured for storing the project lifecycle management database 110. The project lifecycle management database 110 stores the plurality of preview strategies stored in the form of extended markup language format. The product lifecycle management database 110 stores engineering objects along with respective meta file that indicates association between preview strategies associated with the respective engineering objects. The meta file is stored in the form an extendable markup language format. The product lifecycle management database 110 also stores preview images of the engineering objects that are generated based on the associated preview strategies. The network interface 208 may be a communication interface that enables the server 102 to communicate with the user devices 106A-N via the network 104. The bus 210 act as interconnect between the different components of the server 102.

Figure 3:
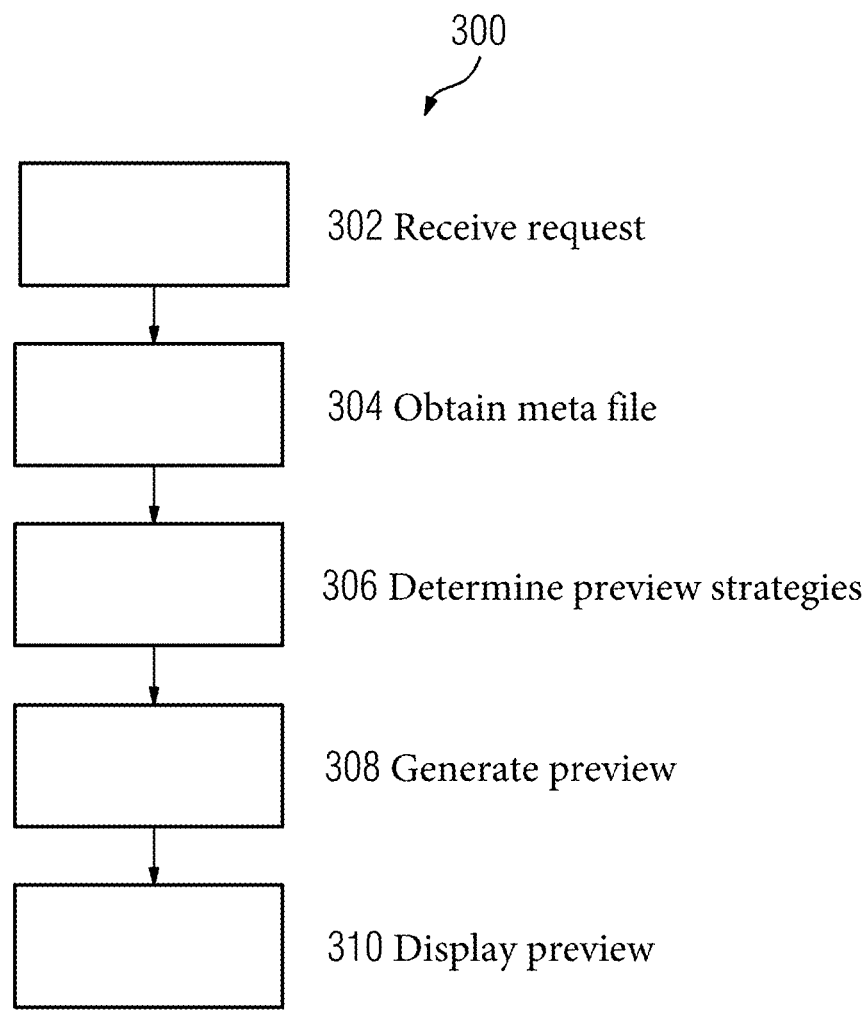
FIG. 3 depicts a process flowchart of a method of dynamically generating a preview of the engineering object in the product lifecycle management environment, according to an embodiment.

FIG. 3 depicts a process flowchart 300 of a method of dynamically generating a preview of an engineering object in a product lifecycle management environment, according to an embodiment. At act 302, a request to display a preview of an engineering object is received from a user device 106A. For example, the engineering object may be a specific PLC object (e.g., PLC12) in a specific automation engineering project (e.g., Project200). At act 304, a meta file indicating association of one or more preview strategies selected from a plurality of preview strategies with the engineering object is obtained from the product lifecycle management database 110. Each preview strategy indicates a type of preview to be generated for the associated engineering object. For example, the associated preview strategy may indicate a detailed device view of the PLC12 of the Project 200 shall be displayed as preview.

At act 306, the one or more preview strategies associated with the engineering object are determined based on the association of the one or more preview strategies with the engineering object in the meta file. For example, type of preview to be determined based on the preview strategy associated with the PLC object. In the instant case, the type of preview to be generated is determined as 'Detailed Device View' of the PLC object. At act 308, a preview of the engineering object is dynamically generated according to the determined preview strategies. The 'Detailed Device View' preview is generated by loading components of the preview strategy associated with the PLC object. At act 310, the generated preview of the engineering object is displayed on a graphical user interface of the user device 106A. The 'Detailed Device View' preview of the PLC12 is displayed on the graphical user interface of the engineering tool 112A.

Figure 4:
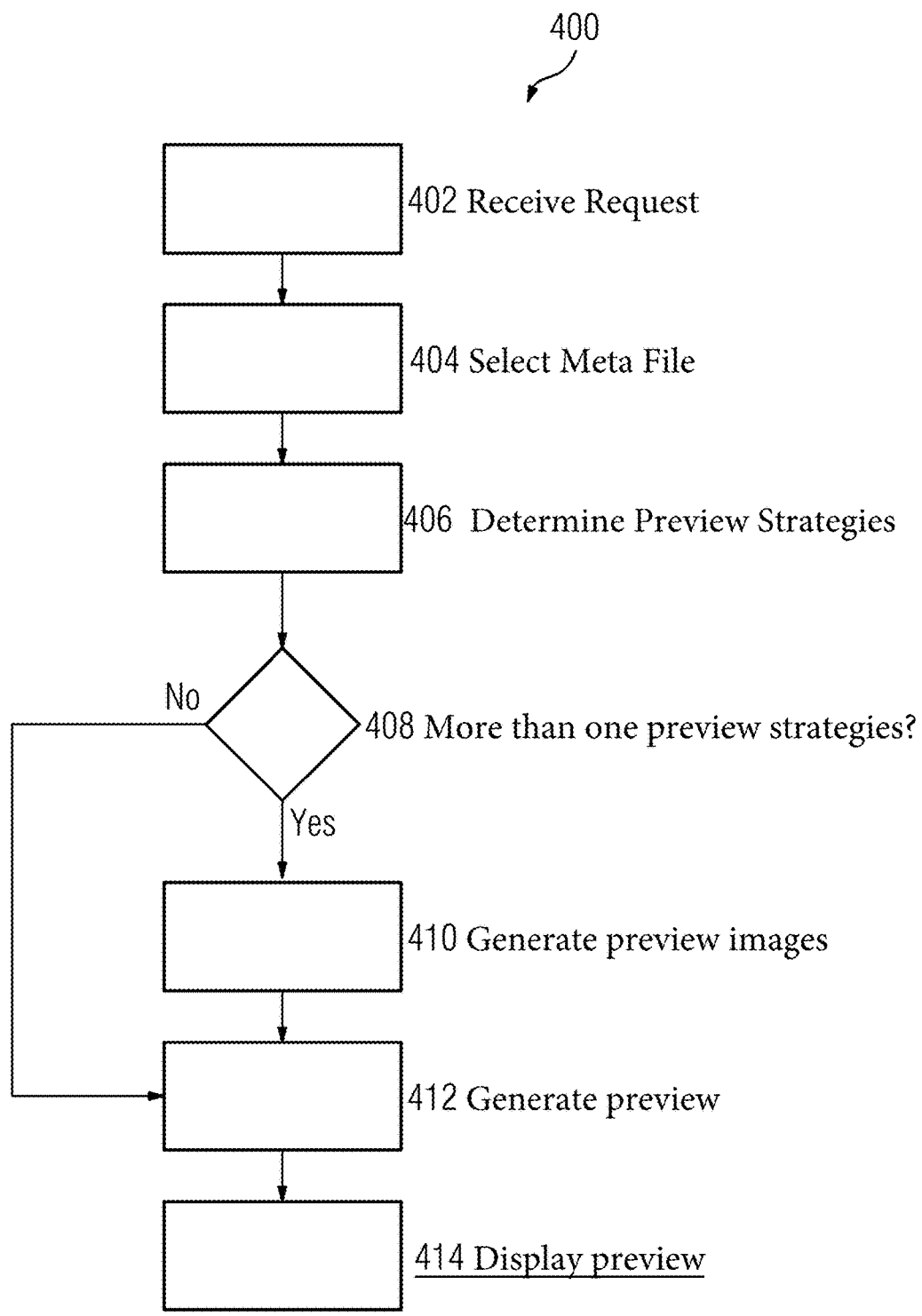
FIG. 4 depicts a process flowchart of a method of dynamically generating a preview of the engineering object in the product lifecycle management environment, according to an embodiment.

FIG. 4 illustrates a process flowchart 400 of a method of dynamically generating a preview of the engineering object in the product lifecycle management environment, according to another embodiment. At act 402, a request to display a preview of the engineering object in the product lifecycle management is received from a user device 106A. At act 404, a meta file indicating association of one or more preview strategies selected from a plurality of preview strategies with the engineering object is obtained from the product lifecycle management database 110.

At act 406, the one or more preview strategies associated with the engineering object are determined based on the association of the one or more preview strategies with the engineering object in the meta file. At act 408, it is determined whether more than one preview strategy is associated with the engineering object. If more than one preview strategy is associated with the engineering object, then at act 410, preview images of the engineering object are generated according to the respective preview strategies. If one preview strategy indicates that 'Detailed Device View' shall be displayed as a preview of the PLC object, an 'Detailed Device View' image is generated. If another preview strategy indicates that 'Function Block List' shall be displayed as a preview of the PLC object, then an 'Function Block List' image is generated. If more than one preview strategy is not associated with the engineering object, then the process 400 is routed to act 412.

Figure 14:
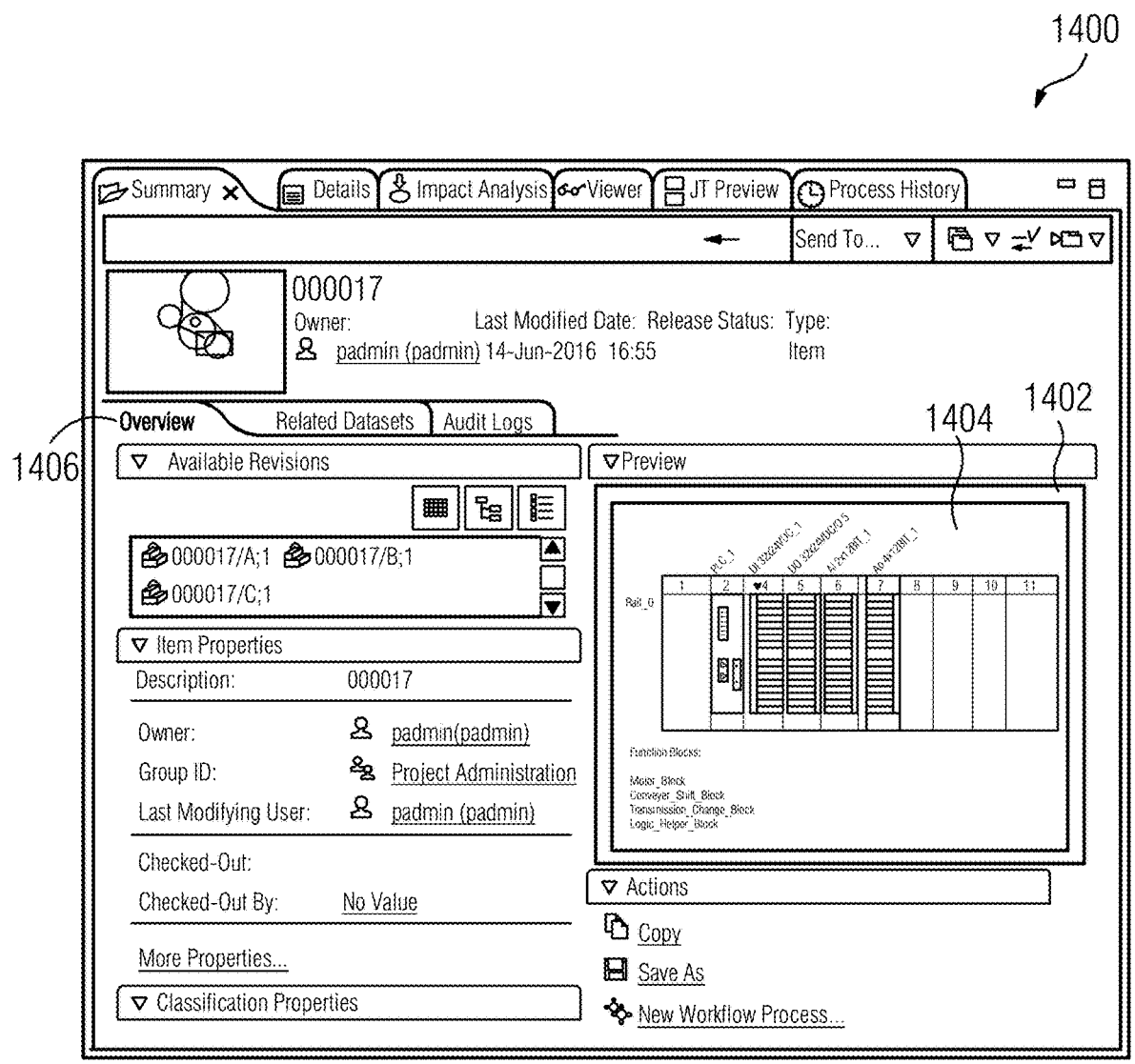

At act 412, a preview of the engineering object is dynamically generated according to the determined preview strategies. If more than one preview strategies are associated with the engineering object, then the preview is of the engineering object is generated by combining the preview images of the engineering objects. The preview of the PLC object is generated by combining the 'Detailed Device View' image and the 'Function Block List' image using appropriate image concatenation technique. If one preview strategy is associated with the engineering object, then the preview of the engineering object is dynamically generated based on the preview image of the engineering object. At act 414, the preview of the engineering object is displayed on a graphical user interface of the user device 106A in response to the request received from the user device 106A. For example, a combined preview of the PLC object is displayed as shown in FIG. 14.

Figure 5:
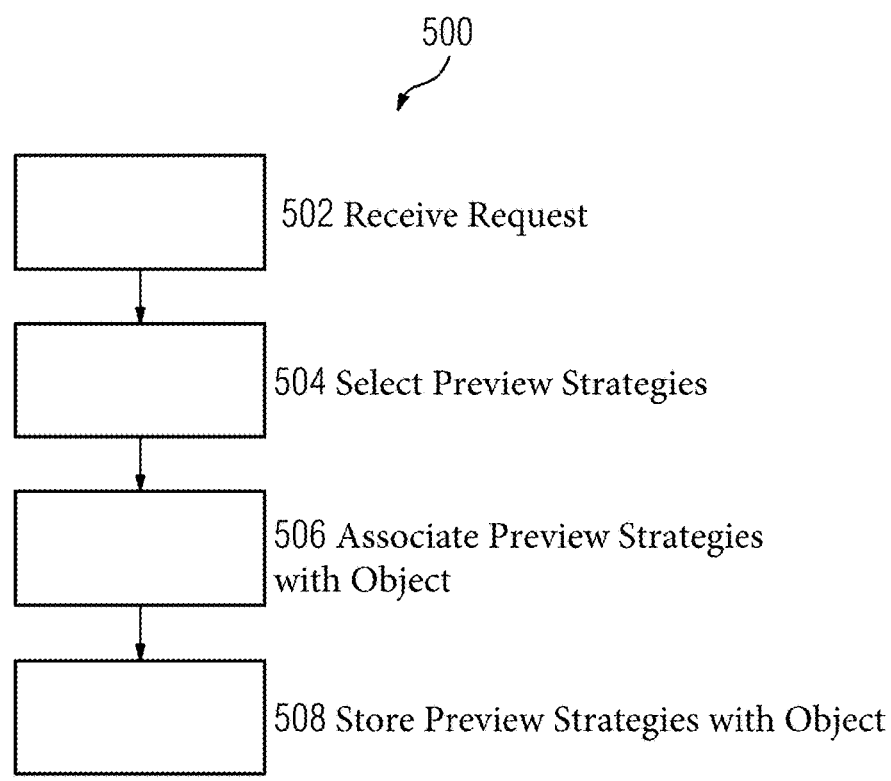
FIG. 5 depicts a process flowchart for a method of associating one or more preview strategies with the engineering object prior to storing the engineering object, according to an embodiment.

FIG. 5 depicts a process flowchart 500 illustrating a method of associating one or more preview strategies with an engineering object prior to storing the engineering object, according to an embodiment. At act 502, a request for storing the engineering object in the project lifecycle management database 110 is received from a user device 106B. For example, a request to store a PLC object (e.g., 'PLC12' associated with an automation engineering project Project200) is received from the user device 106B.

At act 504, one or more preview strategies for displaying a preview of the engineering object is selected from a plurality of preview strategies using attributes associated with the one or more preview strategies. For example, a type of the engineering project to be stored is determined. In this instance, the engineering object to be stored is determined as PLC12. Then, one or more preview strategies that may be associated with the PLC12 are identified from the plurality of preview strategies based on the attributes associated with the one or more preview strategies. The attributes associated with the preview strategies may indicate type of engineering object (e.g., PLC object) with which the preview strategies are allowed to be used. For example, the preview strategies whose attributes indicate type of engineering object allowed as PLC object are identified from the plurality of preview strategies. The list of preview strategies is obtained from the product lifecycle management database 110 in the form of meta file.

Accordingly, one or more preview strategies are selected from the identified preview strategies based on pre-defined criteria. In one embodiment, the one or more preview strategies are selected based on a preset preview preference corresponding to type of the engineering object. For example, a preview preference may indicate that a preview strategy 'Detailed Device View' shall be selected for PLC objects in a specific automation engineering project. In such case, the preview strategy that generates 'Detailed Device View' preview of the PLC object is selected from the identified preview strategies. In another embodiment, the one or more preview strategies are selected based on profile data of users who are likely to access the engineering object. For example, if one user who is authorized or interested in 'Object View' preview of the PLC object is likely to access the PLC object, then the preview strategy that generates 'Object View' preview of the PLC object is selected from the identified preview strategies based on profile data of the user. Similarly, if another user who is authorized or interested in 'Function Block List', then the preview strategy that generates 'Function Block List' preview of the PLC object is selected from the identified preview strategies based on profile data of the user. In yet another embodiment, the one or more preview strategies are selected based on a pattern of previous selection of preview strategies for similar types of engineering objects. For example, if a pattern of selection of preview strategies for PLC object indicates that a preview strategy 'Detailed Device View' is selected for displaying preview of the PLC object, then the preview strategy that may generate 'Detailed Device View' of the PLC object is selected from the identified preview strategies. The pattern is recorded using a series of preview strategies previously selected for displaying the preview of the PLC object. Alternatively, the pattern may be stored based on user preferred preview strategies over system recommended preview strategies.

At act 506, the one or more selected preview strategies are associated with the engineering object. For example, a meta file is created indicating association between the preview strategies and the PLC object. The meta file contains attribute information associated with the selected preview strategies and meta data of the PLC object. At act 508, the engineering object is stored along with the meta file indicating association of the one or more preview strategies with the engineering object in the product lifecycle management database 110. For example, the stored meta file is used to generate a preview of the PLC object according to the one or more preview strategies associated with the PLC object upon receiving a request from the user device 106B.

Figure 6:
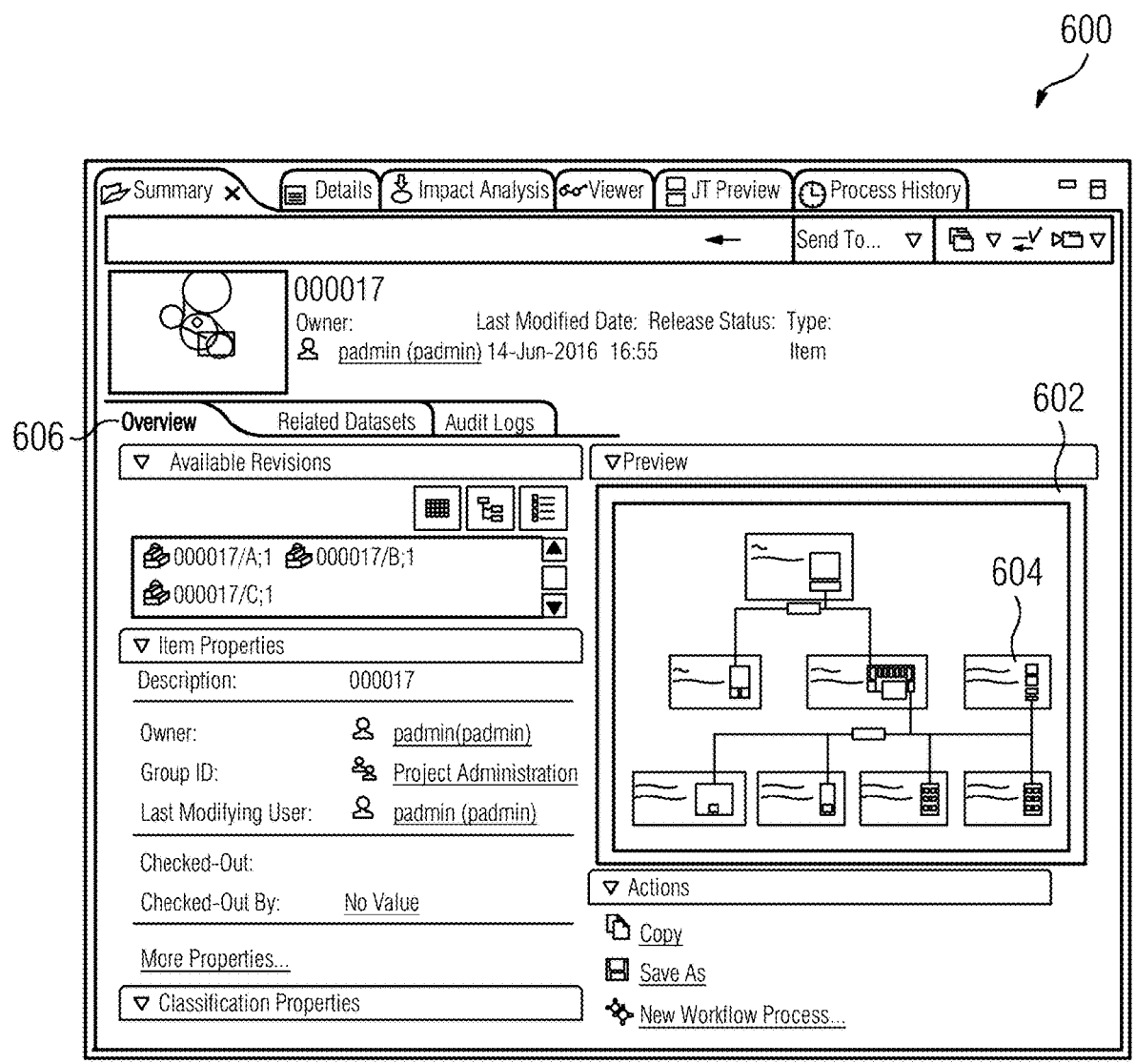
FIGS. 6-14 depict example graphical user interface views of an engineering tool displaying previews of different engineering objects according to associated preview strategies.

FIG. 6 is a graphical user interface view 600 of an engineering tool 112A displaying a preview 604 of an engineering object. A user of the user device 106A wishes to access an automation engineering project (e.g., Project1) such as a hardware configuration using the engineering tool 112A. The user sends a request to display a preview of the automation engineering project to the server 102 using the user device 106A. Accordingly, the server 102 generates a preview 604 of the automation engineering object based on a preview strategy associated with the automation engineering project. For example, the preview strategy indicates that a hardware configuration network view shall be displayed as a preview 604 associated with the automation engineering project. Accordingly, the server 102 provides a preview 604 of the automation engineering project to the user device 106A. The user device 106A displays a hardware configuration network view as the preview 604 of the automation engineering project in a preview window 602 along with overview information 606 associated with the automation engineering project in the engineering tool 112A. By viewing the preview 604 displayed on the user device 106A, the user may understand the automation engineering project is a hardware configuration.

Figure 7:
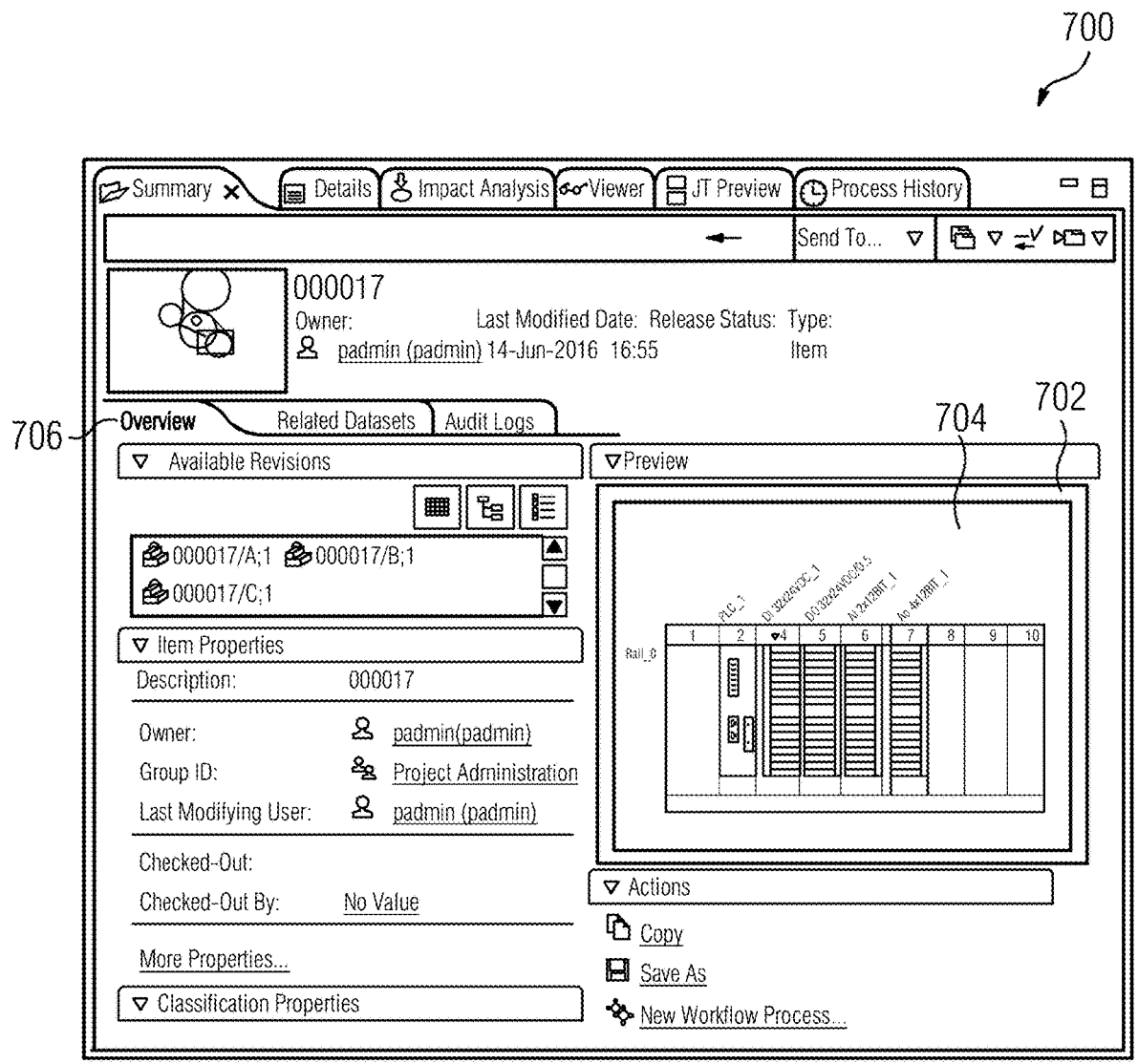

FIG. 7 is a graphical user interface view 700 of an engineering tool 112A displaying a preview 704 of an engineering object. A user of the user device 106A wishes to access a specific type of programmable logic controller (PLC) object (e.g., PLC_23 of Project1) using the engineering tool 112A. The user sends a request to display a preview of the PLC object to the server 102 using the user device. The server 102 generates a preview 704 of the PLC object based on a preview strategy associated with the automation engineering project. For example, the preview strategy indicates that a detailed device view shall be displayed as a preview 704 associated with the PLC object. The server 102 provides a preview 704 of the PLC object to the user device 106A. The user device 106A displays a detailed device view as the preview 704 of the PLC object in a preview window 702 along with overview information 706 associated with the PLC object in the engineering tool 112A. By viewing the preview 704 displayed on the user device 106A, the user may understand details (type, model, ports) of the PLC object used in the specific automation engineering project.

Figure 8:
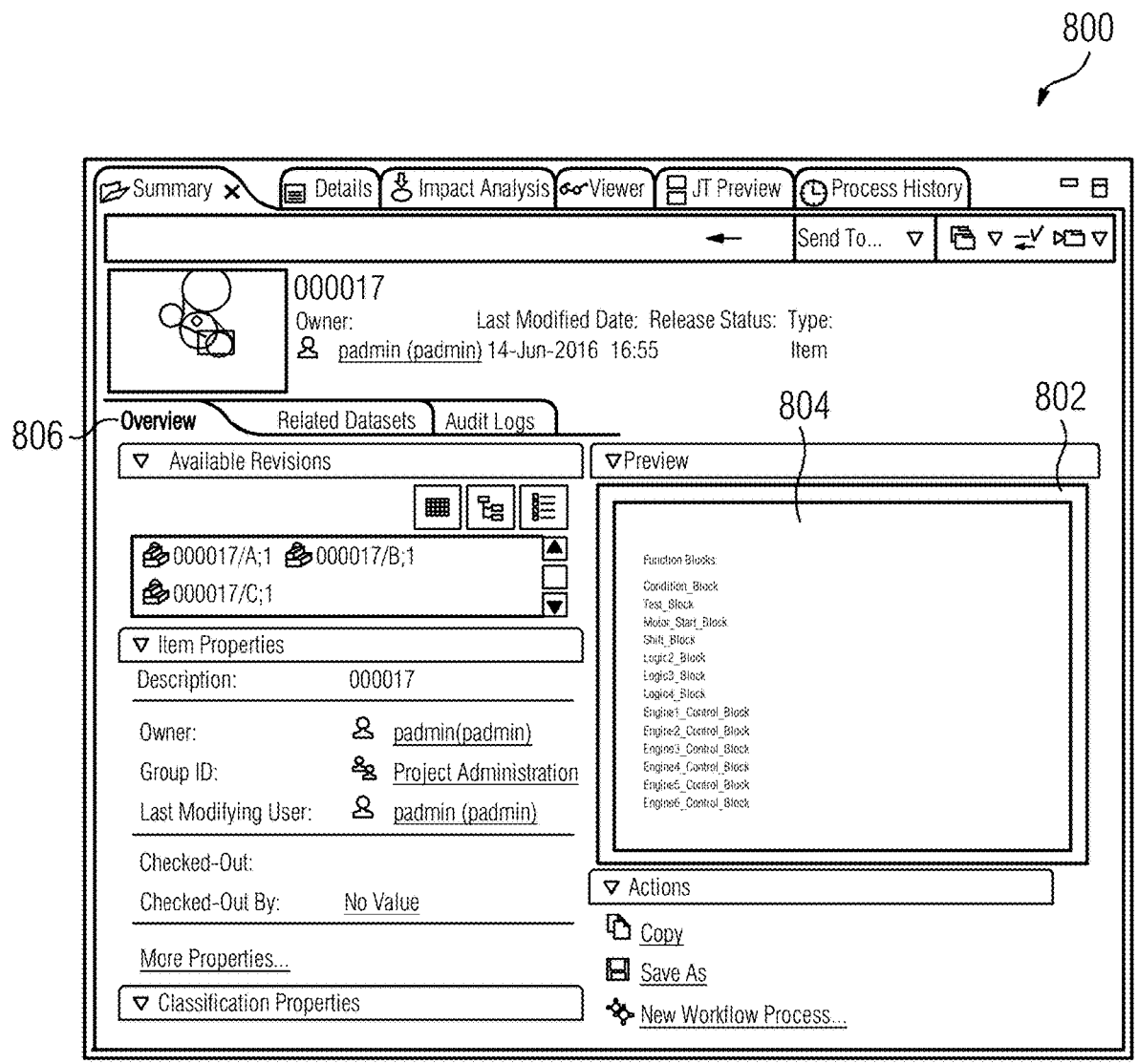

FIG. 8 is a graphical user interface view 800 of an engineering tool 112A displaying a preview 804 of an engineering object. A user of the user device 106A wishes to access a specific type of programmable logic controller (PLC) object (e.g., PLC_7 of Project12) using the engineering tool 112A. The user sends a request to display a preview of the PLC object to the server 102 using the user device. The server 102 generates a preview 804 of the PLC object based on a preview strategy associated with the PLC object. For example, the preview strategy indicates that a function block list displaying function block associated with the PLC object shall be displayed as a preview 804 associated with the PLC object. The server 102 provides a preview 804 of the PLC object to the user device 106A. The user device 106A displays a list of function blocks associated with the PLC object as the preview 804 of the PLC object in a preview window 802 along with overview information 806 associated with the PLC object in the engineering tool 112A. By viewing the preview 804 displayed on the user device 106A, the user may understand function block details associated with the PLC object used in the specific automation engineering project.

Figure 9:
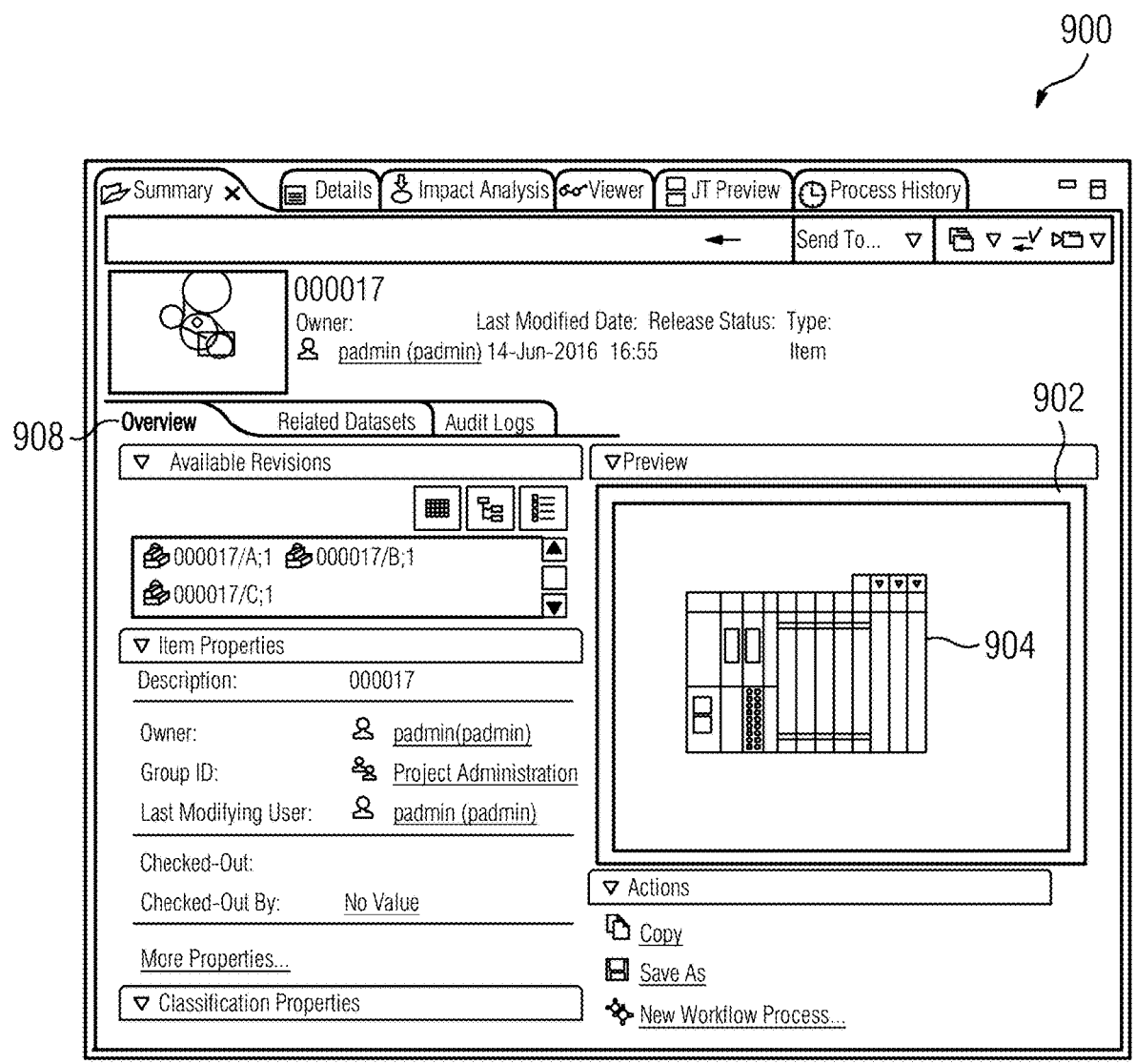

FIG. 9 is a graphical user interface view 900 of an engineering tool 112A displaying a preview 904 of an engineering object. A user of the user device 106A wishes to access a specific type of programmable logic controller (PLC) object (e.g., PLC_1 of Project200) using the engineering tool 112A. The user sends a request to display a preview of the PLC object to the server 102 using the user device. The server 102 generates a preview 904 of the PLC object based on a preview strategy associated with the PLC object. For example, the preview strategy indicates that a detailed device view shall be displayed as a preview 904 associated with the PLC object. The server 102 provides a preview 904 of the PLC object to the user device 106A. The user device 106A displays a detailed device view as the preview 904 of the PLC object in a preview window 902 along with overview information 906 associated with the PLC object in the engineering tool 112A. By viewing the preview 904 displayed on the user device 106A, the user may understand details (type, model, ports) of the PLC object used in the specific automation engineering project.

Figure 10:
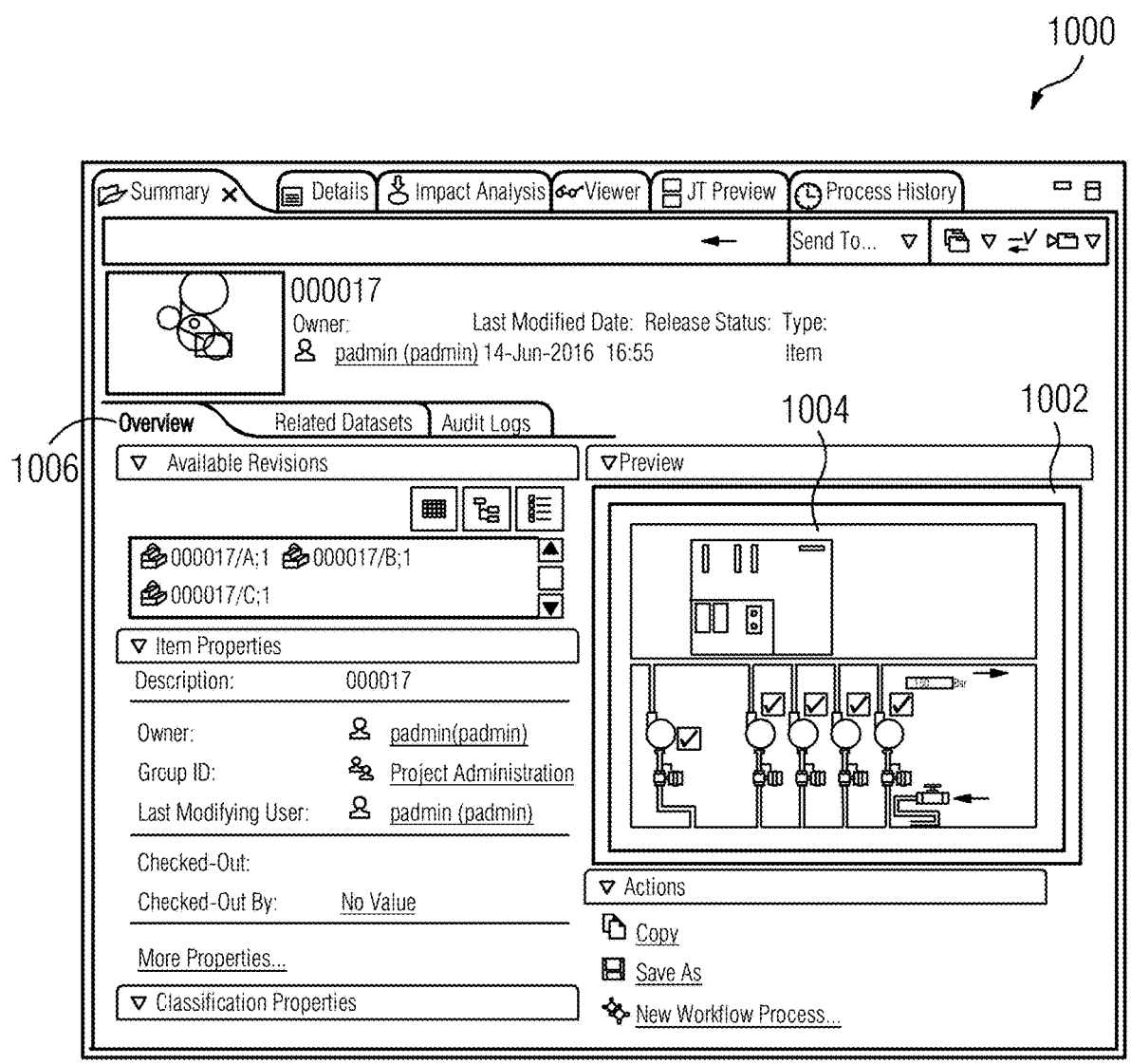

FIG. 10 is a graphical user interface view 1000 of an engineering tool 102A displaying a preview 1004 of an engineering object. A user of the user device 106A wishes to access a specific type of Human-machine interface (HMI) object (e.g., HMI_1 of Project1) using the engineering tool 102A. The user sends a request to display a preview of the HMI object to the server 102 using the user device. The server 102 generates a preview 1004 of the HMI object based on preview strategies associated with the HMI object. For example, a first preview strategy indicates that a detailed device view shall be displayed as a preview 1004 associated with the HMI object and a second preview strategy indicates that a main screen of HMI shall be also displayed as the preview 1004 associated with the HMI object. The server 102 generates detailed device view preview image and main screen preview image and combines the detailed device view preview image and the main screen preview image to generate the preview of the HMI object. The server 102 provides the preview 1004 of the HMI object to the user device 106A. The user device 106A displays the preview 1004 representing the detailed device view and the HMI main screen in a preview window 1002 along with overview information 1006 associated with the HMI object in the engineering tool 102A. By viewing the preview 1004 displayed on the user device 106A, the user may understand details (runtime objects, ports, model, etc.) of the HMI object used in the specific automation engineering project.

Figure 11:
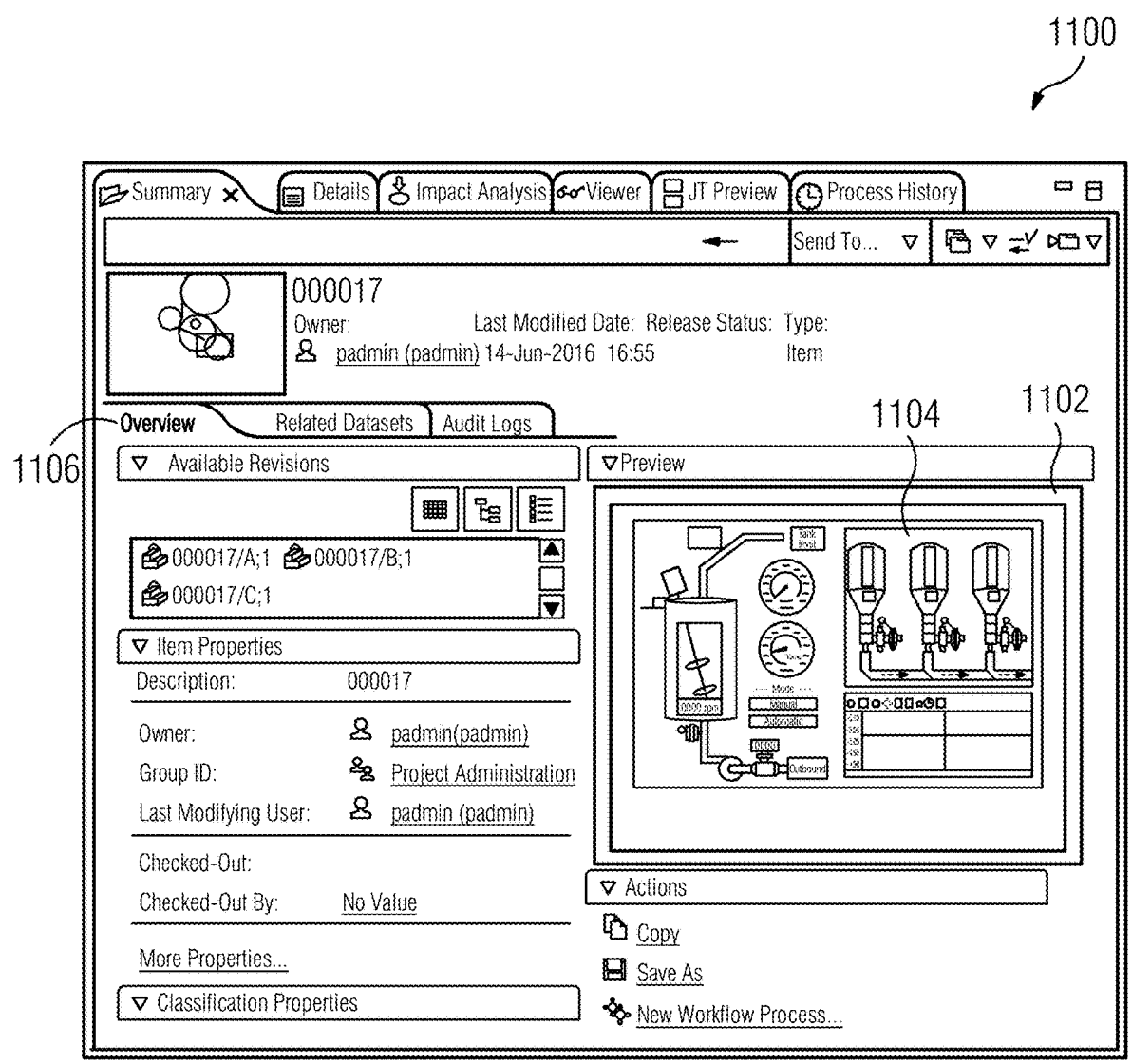

FIG. 11 is a graphical user interface view 1100 of an engineering tool 112A displaying a preview 1104 of an engineering object. A user of the user device 106A wishes to access a specific type of Human-machine interface (HMI) object (e.g., HMI 25 of Project1) using the engineering tool 112A. The user sends a request to display a preview of the HMI object to the server 102 using the user device. Accordingly, the server 102 generates a preview 1104 of the HMI object based on a preview strategy associated with the HMI object. For example, the preview strategy indicates that a main screen of HMI shall be displayed as the preview 1104 associated with the HMI object. The server 102 provides the preview 1104 of the HMI object to the user device 106A. The user device 106A displays the preview 1104 representing the HMI main screen in a preview window 1102 along with overview information 1106 associated with the HMI object in the engineering tool 112A. By viewing the preview 1104 displayed on the user device 106A, the user may understand details (runtime objects, faceplate information, etc.) of the HMI object used in the specific automation engineering project.

Figure 12:
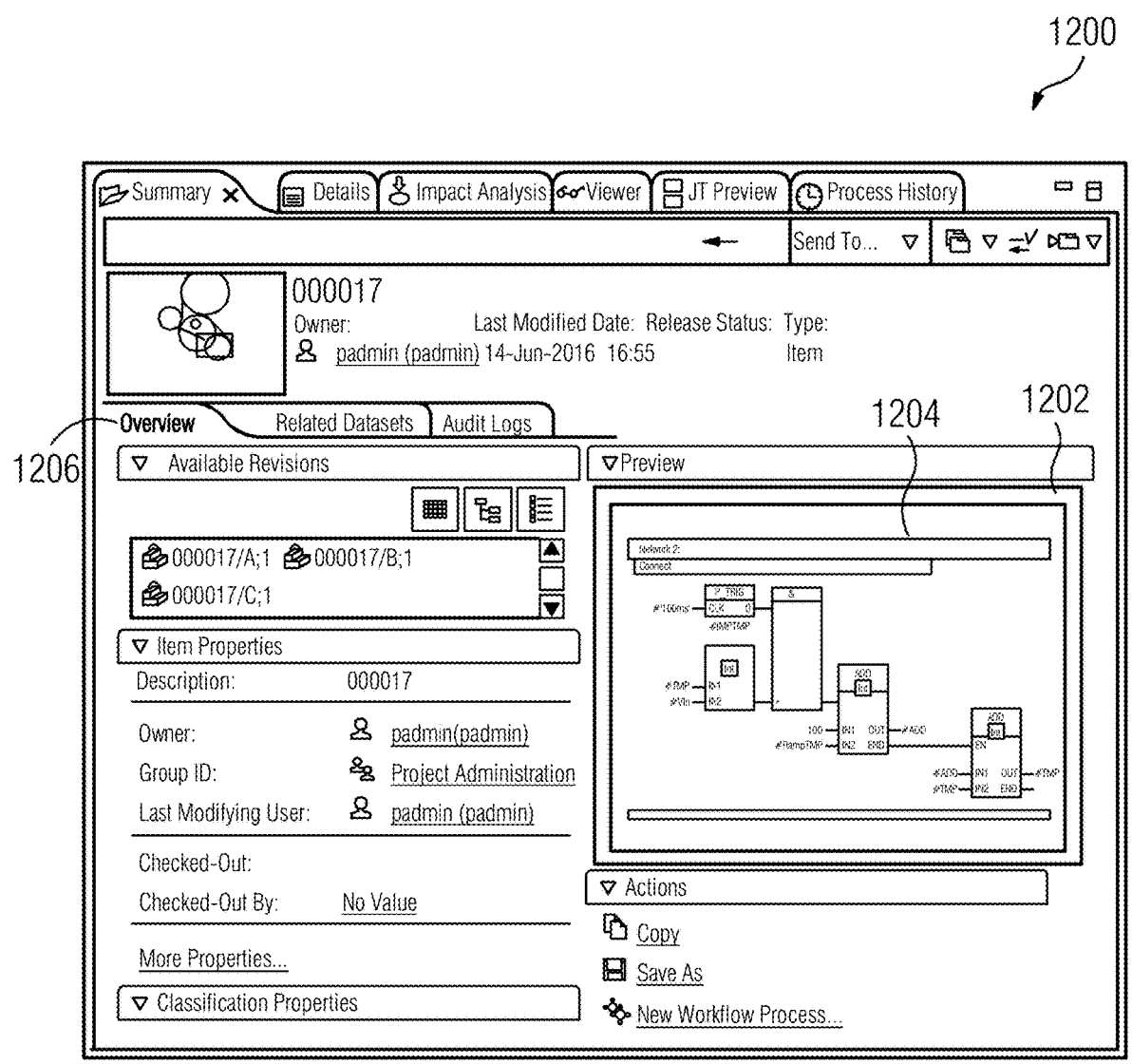

FIG. 12 is a graphical user interface view 1200 of an engineering tool 112A displaying a preview 1204 of an engineering object. A user of the user device 106A wishes to access a specific type of Programmable Logic Controller (PLC) function block (e.g., Motor_Block of PLC_1 in Project1) using the engineering tool 122A. The user sends a request to display a preview of the PLC function block to the server 102 using the user device. Accordingly, the server 102 generates a preview 1204 of the PLC function block based on a preview strategy associated with the PLC function block. For example, the preview strategy indicates that an object view shall be displayed as the preview 1204 associated with the PLC function block. The server 102 provides the preview 1204 of the PLC function block to the user device 106A. The user device 106A displays the preview 1204 representing the object view of PLC function block in a preview window 1202 along with overview information 1206 associated with the PLC function block in the engineering tool 112A. By viewing the preview 1204 displayed on the user device 106A, the user may understand details (connection information, etc.) of the PLC function block used in the specific automation engineering project.

Figure 13:
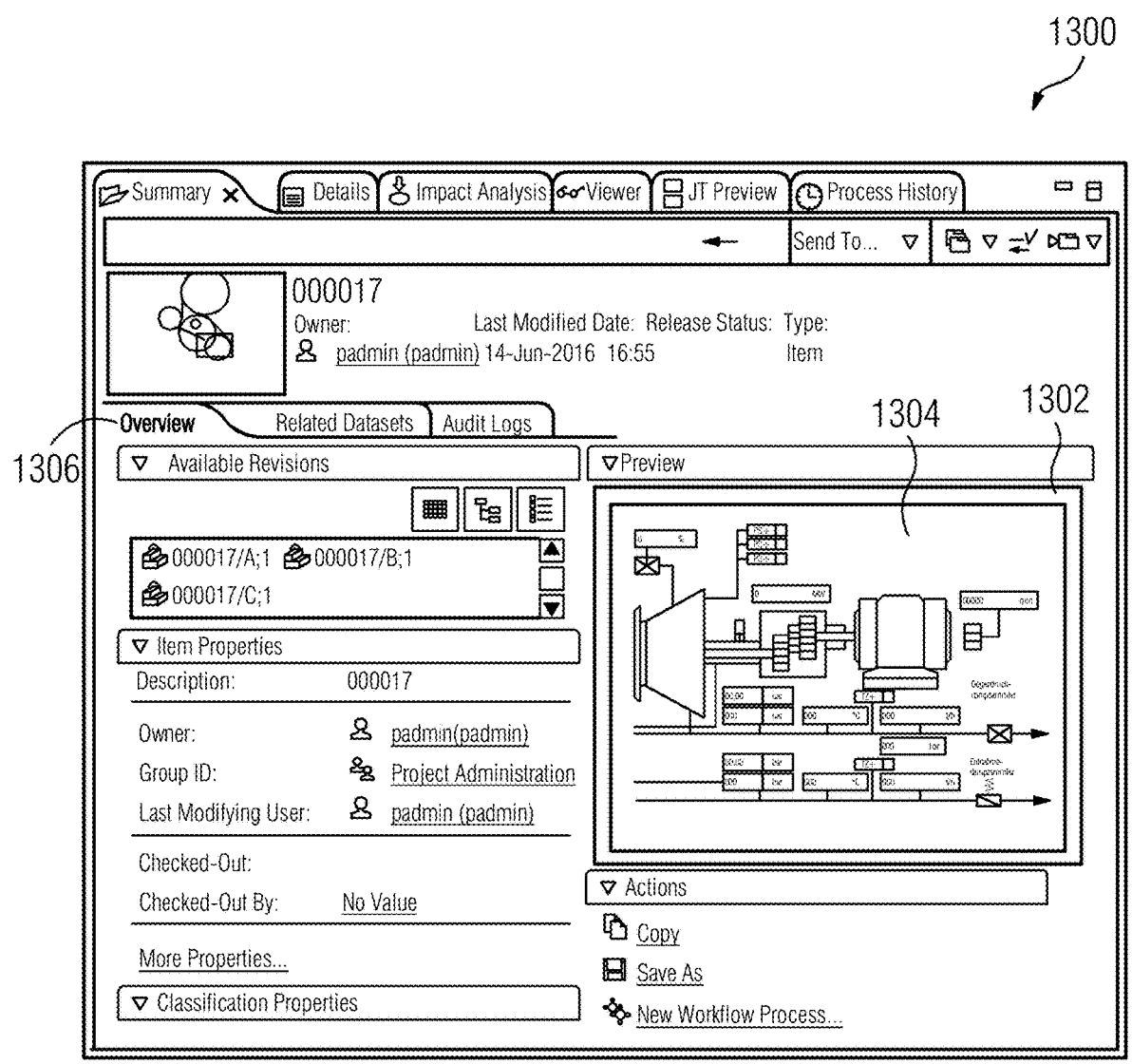

FIG. 13 is a graphical user interface view 1300 of an engineering tool 112A displaying a preview 1304 of an engineering object. A user of the user device 106A wishes to access a specific type of Human-machine interface (HMI) screen (e.g., Cooling-System_Screen of HMI_1 in Project1) using the engineering tool 132A. The user sends a request to display a preview of the HMI screen to the server 102 using the user device. Accordingly, the server 102 generates a preview 1304 of the HMI screen based on a preview strategy associated with the HMI screen. For example, the preview strategy indicates that an object view of HMI screen shall be displayed as the preview 1304 associated with the HMI screen. The server 102 provides the preview 1304 of the HMI screen to the user device 106A. The user device 106A displays the preview 1304 representing the HMI main screen in a preview window 1302 along with overview information 1306 associated with the HMI screen in the engineering tool 112A. By viewing the preview 1304 displayed on the user device 106A, the user may understand details (runtime objects, faceplate information, tag values, etc.) of the HMI screen used in the specific automation engineering project.

FIG. 14 is a graphical user interface view 1400 of an engineering tool 112A displaying a preview 1404 of an engineering object. A user of the user device 106A wishes to access a specific type of programmable logic controller (PLC) object (e.g., PLC_1 of Project1) using the engineering tool 112A. The user sends a request to display a preview of the PLC object to the server 102 using the user device. Accordingly, the server 102 generates a preview 1404 of the PLC object based on a preview strategy associated with the automation engineering project. For example, a first preview strategy indicates that a detailed device view shall be displayed as a preview 1404 associated with the PLC object and a second preview strategy indicates that a function block list shall also be displayed as the preview 1404 associated with the PLC object. The server 102 generates detailed device view preview image and function block list preview image. Then, the server 102 combines the detailed device view preview image and the function block list preview image to generate the preview 1404 of the PLC object. The server 102 provides the preview 1404 of the PLC object to the user device 106A. The user device 106A displays the preview 1404 representing the detailed device view and the function block list in a preview window 1402 along with overview information 1406 associated with the PLC object in the engineering tool 112A. By viewing the preview 1404 displayed on the user device 106A, the user may understand details (type, model, ports, function blocks, etc.) of the PLC object used in the specific automation engineering project.

The present disclosure may take a form of a computer program product including program modules accessible from computer-usable or computer-readable medium storing program code for use by or in connection with one or more computers, processors, or instruction execution system. For the purpose of this description, a computer-usable or computer-readable medium may be any apparatus that may contain, store, communicate, propagate, or transport the program for use by or in connection with the instruction execution system, apparatus, or device. The medium may be electronic, magnetic, optical, electromagnetic, infrared, or semiconductor system (or apparatus or device) or a propagation mediums in and of themselves as signal carriers are not included in the definition of physical computer-readable medium include a semiconductor or solid state memory, magnetic tape, a removable computer diskette, random access memory (RAM), a read only memory (ROM), a rigid magnetic disk and optical disk such as compact disk read-only memory (CD-ROM), compact disk read/write, and DVD. Both processors and program code for implementing each aspect of the technology may be centralized or distributed (or a combination thereof) as known to those skilled in the art.

While the present disclosure has been described in detail with reference to certain embodiments, it should be appreciated that the present disclosure is not limited to those embodiments. In view of the present disclosure, many modifications and variations would be present themselves, to those skilled in the art without departing from the scope of the various embodiments of the present disclosure, as described herein. The scope of the present disclosure is, therefore, indicated by the following claims rather than by the foregoing description. All changes, modifications, and variations coming within the meaning and range of equivalency of the claims are to be considered within their scope. All advantageous embodiments claimed in method claims may also be apply to system/apparatus claims.

The invention claimed is:

1. A method of dynamically generating a preview of an engineering object in a product lifecycle management environment, the method comprising:
receiving, by a processor, a request to display a preview of the engineering object from a user device of a user;
obtaining automatically, by the processor, a meta file from a product lifecycle management database, wherein the meta file comprises information indicative of an association of the engineering object with two or more preview strategies of a plurality of preview strategies, wherein the association of the plurality of preview strategies, is indicative of a specific type of the engineering object with which the preview strategies are allowed to be used, wherein the plurality of preview strategies comprises at least two of a detailed view, a network view, a function block list, a main screen, or an object view;
determining, by the processor, the two or more preview strategies, from the plurality of preview strategies based the association of the two or more preview strategies with the specific type of the engineering object;
generating, by the processor, a plurality of preview images of the engineering object, wherein the plurality of preview images are generated based on one or more components of the determined two or more preview strategies;
concatenating, by the processor, the plurality of preview images of the engineering object, to generate the preview of the engineering object, wherein the user is authorized to view the generated preview; and
generating, by the processor, a graphical user interface view comprising the preview of the engineering object according to the one or more preview strategies associated with the engineering object.

2. The method of claim 1, further comprising:
receiving a request for storing the engineering object;
determining the one or more preview strategies for displaying the preview of the engineering object from the plurality of preview strategies using attributes associated with the one or more preview strategies;
associating the one or more preview strategies with the engineering object; and
storing the engineering object along with the meta file indicating association of the one or more preview strategies with the engineering object in the product lifecycle management database.

3. The method of claim 2, wherein determining the one or more preview strategies for displaying the preview of the engineering object comprises:
determining the one or more preview strategies further based on preset preview preference corresponding to the specific type of the engineering object.

4. The method of claim 2, wherein selecting the one or more preview strategies for displaying the preview of the engineering object further comprises:
selecting the one or more preview strategies based on profile data of users likely to access the engineering object.

5. The method of claim 1, further comprising:
receiving a request to modify the displayed preview of engineering object from a user device, wherein the request to modify the preview comprises a preview strategy for displaying preview of the engineering object;
dynamically generating a preview of the engineering object according to the preview strategy in the request; and
displaying the preview of the engineering object on the graphical user interface of the user device.

6. An apparatus comprising:
a processor;
a memory coupled to the processor, wherein the memory comprises a preview generation module stored in a form of machine-readable instructions executable by the processor, wherein the preview generation module is configured to:
obtain, automatically by the processor, a meta file stored in a form an extendable markup language format indicating association of one or more preview strategies selected from a plurality of preview strategies with an engineering object from a product lifecycle management database, the plurality of preview strategies comprising at least two of a detailed view, a network view, a function block list, a main screen, or an object view, wherein the one or more preview strategies are selected from the plurality of preview strategies based on a pattern of previous selection of preview strategies for similar types of engineering objects, wherein the meta file comprises information indicative of an association of the engineering object with two or more preview strategies of a plurality of preview strategies, wherein the association of the plurality of preview strategies, is indicative of a specific type of the engineering object with which the preview strategies are allowed to be used;

determine, by the processor, two or more preview strategies, from the plurality of preview strategies based on the association of the two or more preview strategies with the specific type of the engineering object;

generate, by the processor, a plurality of preview images of the engineering object, wherein the plurality of preview images are generated based on one or more components of the determined two or more preview strategies;

concatenate, by the processor, the plurality of preview images of the engineering object, to generate a preview of the engineering object; and generate, by the processor, a graphical user interface view comprising the preview of the engineering object according to the one or more preview strategies associated with the engineering object.

7. The apparatus of claim 6, wherein the preview generation module is configured to:

determine, by the processor, the one or more preview strategies for displaying the preview of the engineering object from a plurality of preview strategies further using attributes associated with the one or more preview strategies;

associate the one or more preview strategies with the engineering object; and store the engineering object along with the meta file indicating the association of the one or more preview strategies with the engineering object in the product lifecycle management database.

8. The apparatus of claim 7, wherein in determining the one or more preview strategies, the preview generation module is configured to:

determine, by the processor, the one or more preview strategies based further on preset preview preference corresponding to the specific type of the engineering object.

9. The apparatus of claim 7, wherein in selecting the one or more preview strategies, the preview generation module is configured to:

select, by the processor, the one or more preview strategies further based on profile data of users likely to access the engineering object.

10. A non-transitory computer implemented storage medium, having machine-readable instructions stored therein, that when executed by at least one processor, cause the processor to:

receive a request to display a preview of an engineering object from a user device;

obtain a meta file indicating association of one or more preview strategies selected from a plurality of preview strategies with the engineering object from a product lifecycle management database the plurality of preview strategies comprising at least two of a detailed view, a network view, a function block list, a main screen, or an object view, wherein the one or more preview strategies are selected from the plurality of preview strategies based on a pattern of previous selection of preview strategies for similar types of engineering objects, wherein the meta file comprises information indicative of an association of the engineering object with two or more preview strategies of a plurality of preview strategies, wherein the association of the plurality of preview strategies, is indicative of a specific type of the engineering object with which the preview strategies are allowed to be used;

determine two or more preview strategies, from the plurality of preview strategies based on the association of the two or more preview strategies with the engineering object;

generate a plurality of preview images of the engineering object, wherein the plurality of preview images are generated based on one or more components of the determined two or more preview strategies;

concatenate the plurality of preview images of the engineering objects, to generate a preview of the engineering object; and generate a graphical user interface view comprising the preview of the engineering object according to the one or more preview strategies associated with the engineering object.

11. The storage medium of claim 10, wherein the machine-readable instructions cause the processor to:

receive a request for storing the engineering object determine the one or more preview strategies for displaying the preview of the engineering object from the plurality of preview strategies further using attributes associated with the one or more preview strategies;

associate the one or more preview strategies with the engineering object; and store the engineering object along with the meta file indicating association of the one or more preview strategies with the engineering object in the product lifecycle management database.

12. The storage medium of claim 10, wherein the machine-readable instructions cause the processor to:

receive a request to modify the displayed preview of engineering object from a user device, wherein the request to modify the preview comprises a preview strategy for displaying preview of the engineering object;

dynamically generate a preview of the engineering object according to the preview strategy in the request; and display the preview of the engineering object on the graphical user interface of the user device.

* * * * *